(12) United States Patent
Gillespie et al.

(10) Patent No.: US 8,850,278 B2
(45) Date of Patent: Sep. 30, 2014

(54) FAULT TOLERANT SCANNABLE GLITCH LATCH

(75) Inventors: Kevin M. Gillespie, Pembroke, MA (US); Joseph R. Siegel, Brookline, MA (US); Dwight K. Elvey, Santa Cruz, CA (US); Harry R. Fair, Arlington, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 724 days.

(21) Appl. No.: 12/976,170

(22) Filed: Dec. 22, 2010

(65) Prior Publication Data
US 2012/0166899 A1    Jun. 28, 2012

(51) Int. Cl.
  *G06F 11/00*    (2006.01)
  *G01R 31/3185*    (2006.01)
(52) U.S. Cl.
  CPC .............................. *G01R 31/318541* (2013.01)
  USPC ........................................................ 714/726
(58) Field of Classification Search
  CPC .... H01H 7/002; H01H 47/16; F04D 27/0207; F04D 29/5833; G01R 31/318541
  USPC ........ 714/726; 327/202, 203, 208; 377/79, 81
  See application file for complete search history.

(56) References Cited

U.S. PATENT DOCUMENTS

| | | | |
|---|---|---|---|
| 6,467,057 B1 * | 10/2002 | Wang et al. | 714/726 |
| 6,785,855 B2 * | 8/2004 | Zhang et al. | 714/731 |
| 2003/0093734 A1 * | 5/2003 | Zhang et al. | 714/731 |
| 2003/0145264 A1 * | 7/2003 | Siegel et al. | 714/726 |
| 2003/0145265 A1 * | 7/2003 | Siegel | 714/726 |
| 2007/0013426 A1 * | 1/2007 | Chen et al. | 327/217 |

* cited by examiner

*Primary Examiner* — Bryce Bonzo
*Assistant Examiner* — Elmira Mehrmanesh
(74) *Attorney, Agent, or Firm* — Volpe and Koenig, P.C.

(57) ABSTRACT

A fault tolerant scannable glitch latch for use with scan chains that enable reset, debug and repairability of machines and parts is described. A scan shift enable signal controls a switch such that a stuck-at zero fault on a data input line is prevented from driving voltage to a state node or pulling the state node high during a scan chain operation. Propagation of the stuck-at zero fault is therefore eliminated. The scan shift enable signal also controls a switch that enables a parallel path to ground for the scan data and state node which would otherwise have been driven high due to the stuck-at zero fault.

21 Claims, 7 Drawing Sheets

300

FAULT TOLERANT SCANNABLE GLITCH LATCH

FIELD OF INVENTION

This application is related to machine resets and latches.

BACKGROUND

Computer processor resets may be performed by distributing a reset signal to each state element, logic cone or the like, to clear the current state. This may be done at initialization so that each state element is at a known state. Scan chains, which may be used to detect manufacturing defects in integrated circuits, may also be used to reset the initial state of a machine such as a central processing unit. Scan chains, however, may interact with different parts such as the array. If the array has a stuck-at fault, then this fault may be propagated onto the scan chain and may prevent debug, repairability, or resetting the machine or part.

SUMMARY OF EMBODIMENTS

A fault tolerant scannable glitch latch for use with scan chains that enable reset, debug and repairability of machines and parts is provided. A scan shift enable signal controls a switch such that a stuck-at zero fault on a data input line is prevented from driving voltage to a state node or pulling the state node high during a scan chain operation. Propagation of the stuck-at zero fault is therefore eliminated. The scan shift enable signal also controls a switch that enables a parallel path to ground for the scan data and state node which would otherwise have been tri-stated due to the stuck-at zero fault.

DETAILED DESCRIPTION OF THE EMBODIMENTS

The scan chain is a serial chain that connects all state elements or nodes in a machine such as a central processing unit and allows all state elements to be resettable and in particular, to be reset to a known state. However, as shown herein, the scan chain working with a standard glitch latch is susceptible to stuck-at faults. Stuck-at faults, for example, may provide a value of zero/one when the value is supposed to be one/zero. Since the scan chain is a serial chain, the stuck-at fault may propagate down the chain. This prevents proper debug, reset and repair of the machine or part. For example, during a logic test a value may be shifted into the machine through the scan chain to reset and put the machine into any state. The machine is stopped after running several cycles and the data is captured that reflects the current state of the machine. If a stuck-at fault exists on the scan chain, then the resulting scan capture will be overwritten by the stuck-at fault when shifting the captured data out of the machine.

Described herein is a fault tolerant scannable glitch latch that may prevent stuck-at faults from propagating onto a scan chain and enable proper reset, array repair and debug. The fault tolerant scannable glitch latch may prevent stuck-at zero faults from propagating through a scannable glitch latch and creating a stuck-at fault on the scan chain. Scan chains together with the fault tolerant scannable glitch latch, therefore, may be used to reset the machine without impacting debug and repairability, enabling the machine to be initialized to a known state without a reset signal having to be distributed to each state element. A faulty array may be properly repaired and reset using the scan chain even in the presence of a stuck-at zero fault.

Figure 1:
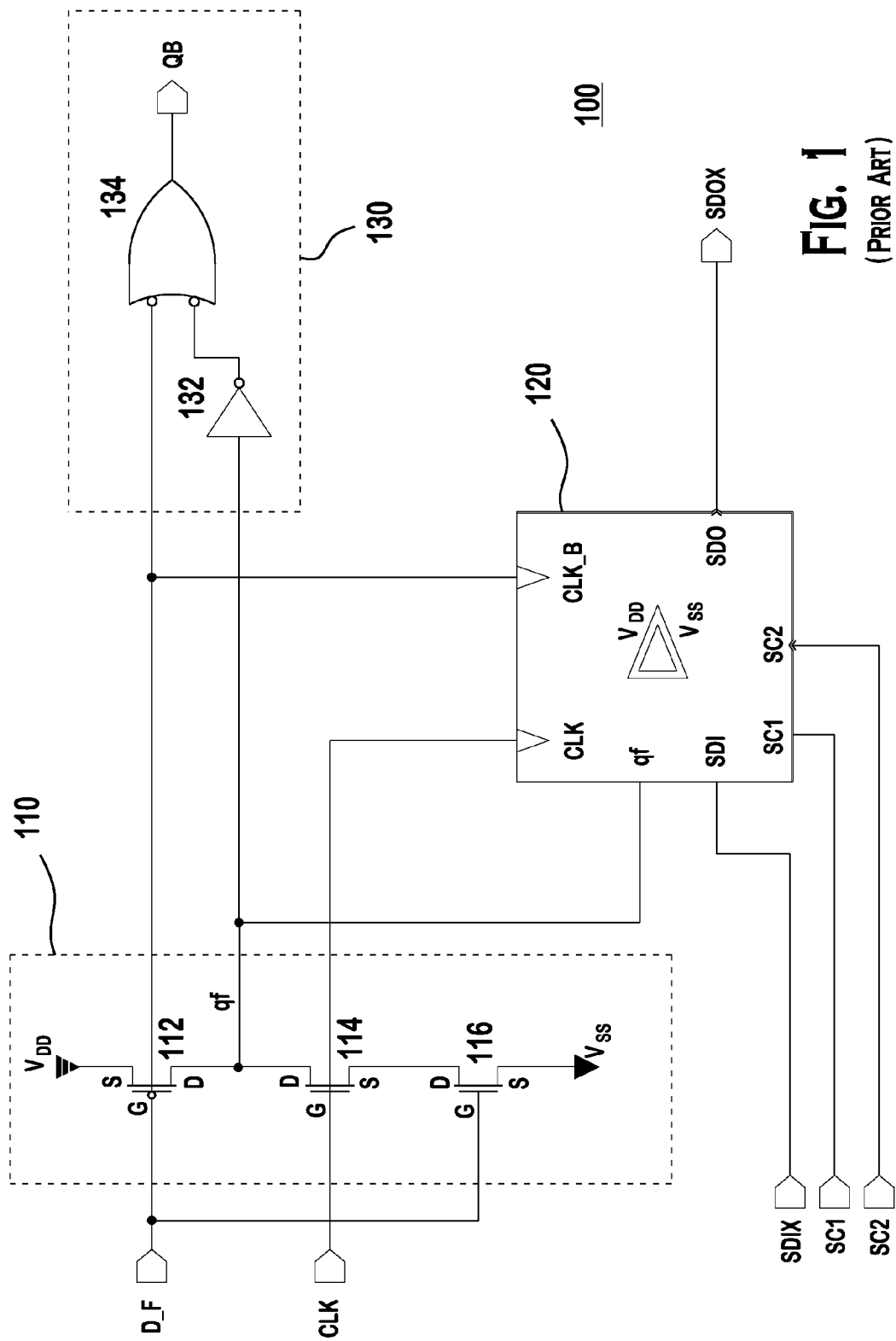
FIG. 1 is an embodiment of a glitch latch.

FIG. 1 is a standard glitch latch 100. Glitch latch 100 includes an input circuit 110 that may be electrically and/or operatively connected to a scannable latch 120 and a logic circuit 130.

Input circuit 110 includes a p-channel metal-oxide-semiconductor field-effect transistor (MOSFET) (PMOS) transistor 112 having a source connected to supply voltage ($V_{DD}$), a gate connected to a super-bitline input (D_F) and a drain connected to a drain of n-channel MOSFET (NMOS) transistor 114. The NMOS transistor 114 has a gate connected to a clock signal (CLK) and a source connected to a drain of a NMOS transistor 116. The NMOS transistor 116 has a gate connected to D_F and a source connected to ground (Vss). A state node (qf) is situated between the drain of PMOS transistor 112 and the drain of NMOS transistor 114.

The scannable latch 120 has inputs for the CLK signal, the D_F signal (at input CLK_B), the state node (qf), a scan clock 1 signal (SC1) and scan clock 2 signal (SC2). It also has a scan data input (SDI) for scan data input signal (SDIX) and a scan data output (SDO) for scan data output signal (SDOX). The SDOX is used to connect the serial scan shift chain but is otherwise inoperative during normal operation.

The logic circuit 130 includes an inverter 132 having state node (qf) as an input and an output connected to one input of a logical Not And (NAND) gate 134. A second input of the NAND gate 134 is tied to D_F. The logical output of the NAND gate 134 is the signal QB, which is the data output of the glitch latch 100 during normal operations.

Figure 2:
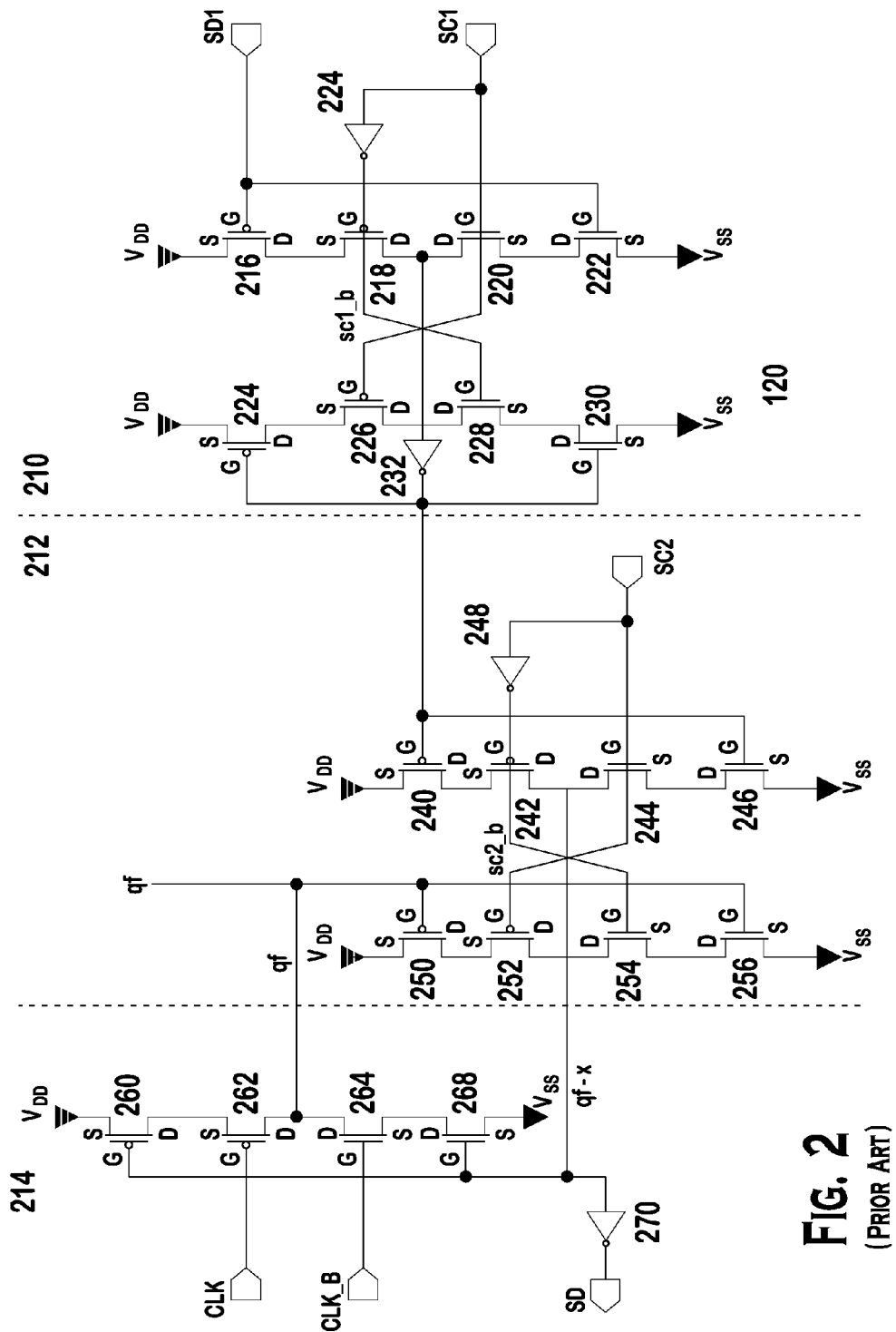
FIG. 2 is an embodiment of a scannable latch of a glitch latch.

FIG. 2 is a schematic of the scannable latch 120. Scannable latch 120 has a master scan latch 210, a slave scan latch 212 and an output circuit 214. Master scan latch 210 includes a PMOS transistor 216 having a source connected to $V_{DD}$, a gate connected to a SDI input, and a drain connected to a source of PMOS transistor 218. The PMOS transistor 218 has a drain connected to a drain of NMOS transistor 220 and a gate connected to a SC1 signal via an inverter 224. The NMOS transistor 220 has a gate connected to a SC1 signal and a source connected to a drain of NMOS transistor 222. The NMOS transistor 222 has a gate connected to a SDI input and a source connected to ground. Master scan latch 210 further includes a PMOS transistor 224 having a source connected to $V_{DD}$, a gate connected to the output of inverter 232, and a drain connected to a source of PMOS transistor 226. The PMOS transistor 226 has a drain connected to a drain of NMOS transistor 228 and a gate connected to a SC1 signal. The NMOS transistor 228 has a gate connected to a SC1 signal via an inverter 224 and a source connected to a drain of NMOS transistor 230. The NMOS transistor 230 has a gate connected to the output of inverter 232 and a source connected to ground. An input for inverter 232 is obtained from the connection between PMOS transistor 218 and NMOS transistor 220 and the connection between PMOS transistor 226 and NMOS transistor 228.

Slave scan latch 212 includes a PMOS transistor 240 having a source connected to $V_{DD}$, a gate connected to an output of inverter 232, and a drain connected to a source of PMOS transistor 242. The PMOS transistor 242 has a drain connected to a drain of NMOS transistor 244 and a gate connected to a SC2 signal via an inverter 248. The NMOS transistor 244 has a gate connected to a SC2 signal and a source connected to a drain of NMOS transistor 246. The NMOS transistor 246 has a gate connected to the output of inverter gate 232 and a source connected to ground. Slave scan latch 212 further includes a PMOS transistor 250 having a source connected to $V_{DD}$, a gate connected to qf, and a drain connected to a source of PMOS transistor 252. The PMOS transistor 252 has a drain connected to a drain of NMOS transistor 254 and a gate connected to a SC2 signal. The NMOS transistor 254 has a gate connected to a SC2 signal via an inverter 248 and a source connected to a drain of NMOS transistor 256. The NMOS transistor 256 has a gate connected qf and a source connected to ground. A qf_x value may be obtained from the connection between PMOS transistor 242 and NMOS transistor 244 and the connection between PMOS transistor 252 and NMOS transistor 254.

Output circuit 214 includes a PMOS transistor 260 having a source connected to $V_{DD}$, a gate tied to qf_x, and a drain connected to a source of PMOS transistor 262. The PMOS transistor 262 has a drain connected to a drain of NMOS transistor 264 and a gate connected to a CLK signal. The NMOS transistor 264 has a gate connected to a CLK_B signal (which is the D_F signal) and a source connected to a drain of NMOS transistor 268. The NMOS transistor 268 has a gate tied to qf_x and a source connected to ground. An inverter 270 has qf_x as an input and SDO as an output. The state node qf is situated between the drain of PMOS transistor 262 and the drain of NMOS transistor 264. During a normal scan shift operation, (as explained in greater detail below), CLK is disabled and set to low and CLK_B is set to high. Therefore the state node qf will be driven low when qf_x (also SDO) is high. However, during a stuck-at zero fault scenario, CLK_B is low, and the state node qf will be driven high when qf_x (SDO) is high. Therefore even if the scan data is trying to reset this state element to zero it can't because the state node is pulled high.

Figure 3:
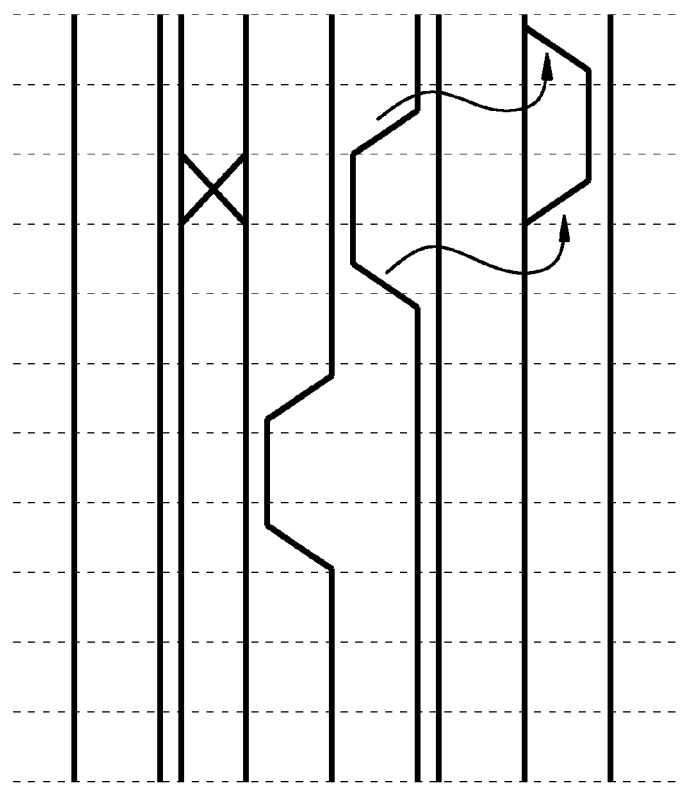
FIG. 3 is a timing diagram for the glitch latch and scannable latch of FIGS. 1 and 2, respectively, with a stuck-at zero fault.

FIG. 3 illustrates a scan timing diagram 300 for glitch latch 100 and scannable latch 200 with a stuck-at zero fault at the D_F input. In summary and explained in more detail below, the CLK is disabled and set to low during a scan shift operation. SDIX scans data in via SC1 and SC2. In particular, SC1 clocks scan data input into the master scan latch 210 and SC2 clocks scan data input from the master scan latch 210 into the slave scan latch 212. The data output, QB, is driven high due to the stuck-at zero fault at the D_F input. The scan data output, SDOX, is driven high due to the stuck-at zero fault at the D_F input except when SC2 is asserted. The state node, qf, is driven high due to the stuck-at zero fault at the D_F input.

The standard glitch latch 100, shown in FIGS. 1 and 2 and operationally in FIG. 3, is susceptible to stuck-at zero faults. A stuck-at zero fault being a situation when a circuit, such as a memory array or the like, has an element that is defective and outputs a zero when a one is supposed to be present. Operationally, the standard glitch latch 100 shown in FIGS. 1 and 2 allows a stuck-at zero fault to propagate through the glitch latch 100 when a shift scan operation is enabled. During a scan shift operation, the array is in a precharge state (i.e., the array superbit lines are set to high) and the clock, CLK, is low. This combination of inputs tri-states input circuit 110, meaning that input circuit 110 does not actively drive a voltage onto state node qf during a scan shift operation when no stuck-at zero fault is present. This allows the output circuit 214 to drive data from the slave scan latch onto the state node qf, thereby initializing the state through use of the scan chain. In particular, SDIX scans data in via SC1 and SC2 and an inverted version is presented at the state node. In effect, data that may be used to reset the state node is scanned and shifted onto the scan chain using SC1 and SC2. If a stuck-at zero fault exists on the array, then the stuck-at zero fault is present at the D_F input. If a stuck-at zero fault exists, then D_F will be zero even when D_F is supposed to be at a precharged high value. For example, during a scan operation, PMOS transistor 112 is supposed to be off. However, in the case of a stuck-at zero fault, the PMOS transistor 112 will be on. The state node (i.e., qf) will be driven to $V_{DD}$. Therefore even if the scan data is trying to reset this state element to zero it can't because the state node is pulled high. The state node, therefore, may not be reset to the desired value and may propagate to the rest of the scan chain as it will be serially shifted downstream from this point. The downstream state elements will be reset to a value based on the stuck-at fault rather than the intended value that was applied on the scan chain.

As shown in FIG. 2, the stuck-at zero fault prevents a path to ground for the state node during scan shift since CLK_B is zero rather than its intended value of one. This results in the state node being driven to a one thru PMOS device 112 and prevents scan data shifted onto node qf_x from being able to drive state node qf low through output circuit 214.

Figure 4:
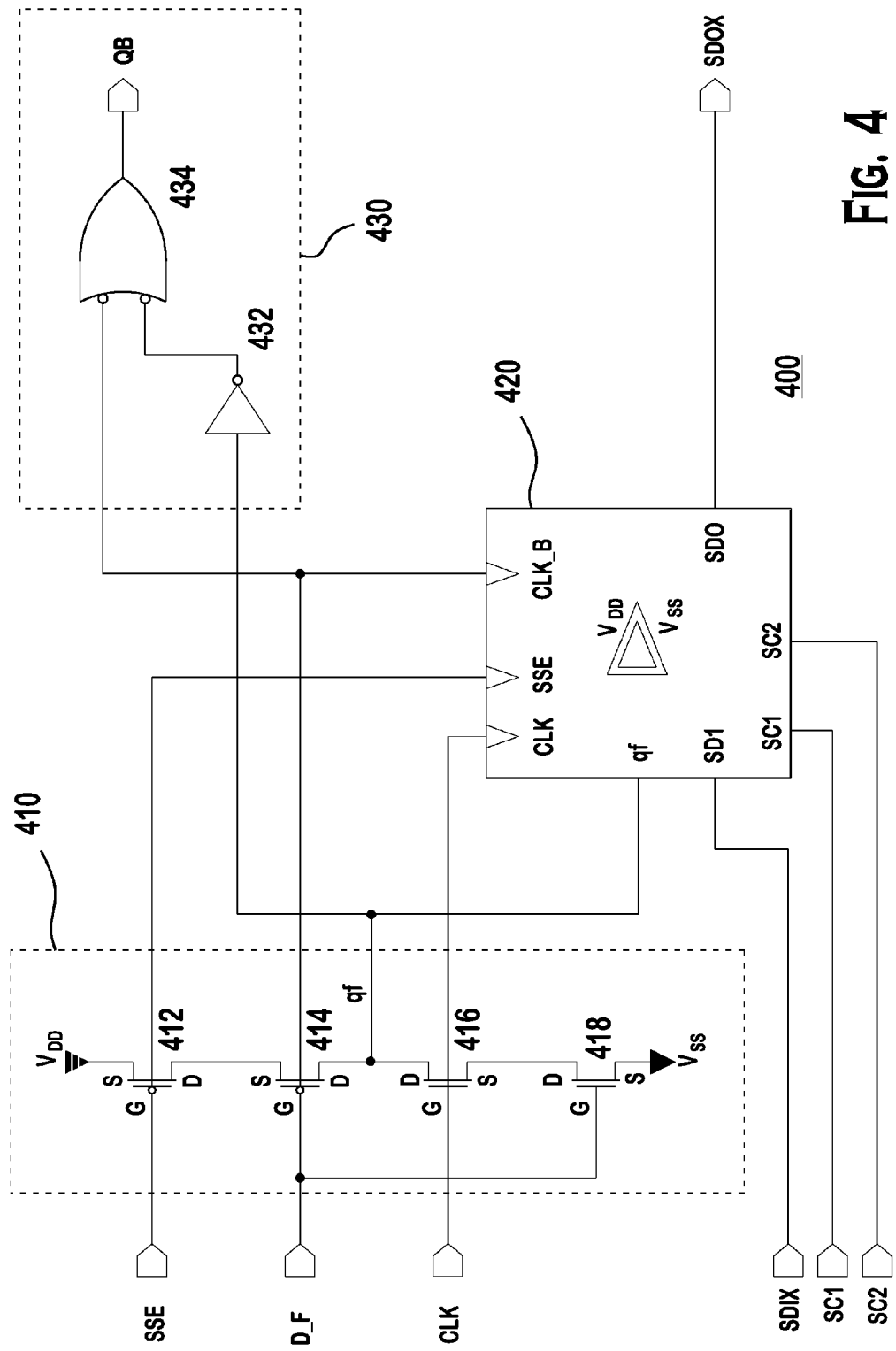
FIG. 4 is an example embodiment of a fault tolerant scannable glitch latch.

FIG. 4 is an example embodiment of a fault tolerant scannable glitch latch 400. Fault tolerant scannable glitch latch 400 includes an input circuit 410 that may be electrically and/or operatively connected to a scannable latch 420 and a logic circuit 430.

Input circuit 410 includes a p-channel metal-oxide-semiconductor field-effect transistor (MOSFET) (PMOS) transistor 412 having a source connected to supply voltage ($V_{DD}$), a gate connected to scan shift enable (SSE) and a drain connected to a source of PMOS transistor 414. The PMOS transistor 414 has a gate connected to a super-bitline input (D_F) and a drain connected to a drain of n-channel MOSFET (NMOS) transistor 416. The NMOS transistor 416 has a gate connected to a clock signal (CLK) and a source connected to a drain of a NMOS transistor 418. The NMOS transistor 418 has a gate connected to D_F and a source connected to ground (Vss). A state node (qf) value is obtained from the connection between PMOS transistor 414 and PMOS transistor 416. The D_F input to the fault tolerant scannable glitch latch 400 may be held in precharge during scan. This allows scan data to propagate through the fault tolerant scannable glitch latch 400 when a scan is enabled.

The scannable latch 420 has inputs for the CLK signal, the SSE signal, the D_F signal (CLK_B), the state node (qf), a scan clock 1 signal (SC1) and scan clock 2 signal (SC2). It also has a scan data input (SDI) for scan data input signal (SDIX) and a scan data output (SDO) for scan data output signal (SDOX).

The logic circuit 430 includes an inverter 432 having state node (qf) as an input and an output connected to one input of a logical Not And (NAND) gate 434. A second input of the NAND gate 434 is tied to D_F. The logical output of the NAND gate 434 is the signal QB.

Figure 5:
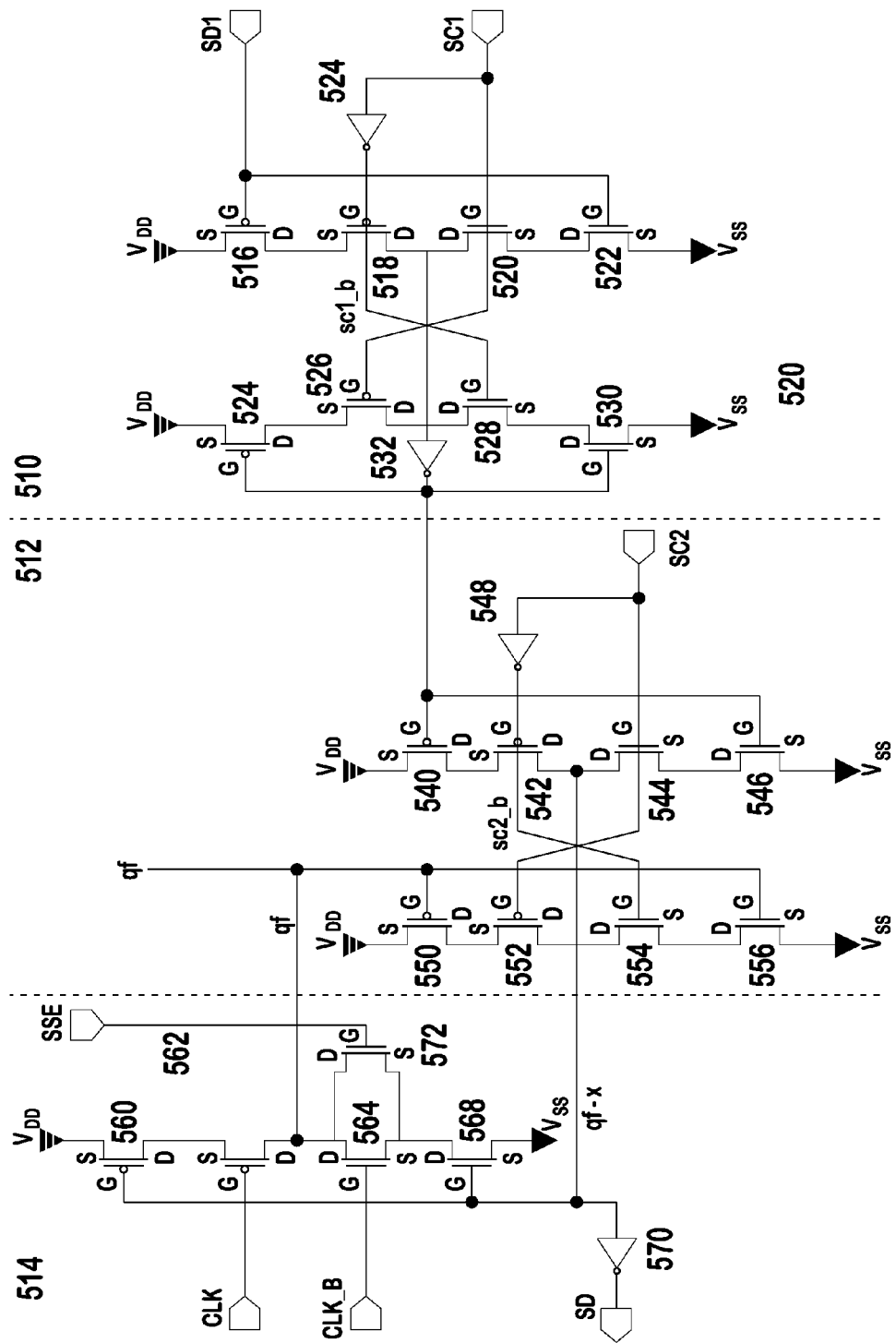
FIG. 5 is an example embodiment of a scan circuit of a fault tolerant scannable glitch latch.

FIG. 5 is an example embodiment of the scannable latch 420. Scannable latch 420 has a master scan latch 510, a slave scan latch 512 and an output circuit 514. Master scan latch 510 includes a PMOS transistor 516 having a source connected to $V_{DD}$, a gate connected to a SDI input, and a drain connected to a source of PMOS transistor 518. The PMOS transistor 518 has a drain connected to a drain of NMOS transistor 520 and a gate connected to a SC1 signal via an inverter 524. The NMOS transistor 520 has a gate connected to a SC1 signal and a source connected to a drain of NMOS transistor 522. The NMOS transistor 522 has a gate connected to a SDI input and a source connected to ground. Master scan latch 510 further includes a PMOS transistor 524 having a source connected to $V_{DD}$, a gate connected to the output of an inverter 532, and a drain connected to a source of PMOS transistor 526. The PMOS transistor 526 has a drain connected to a drain of NMOS transistor 528 and a gate connected to a SC1 signal. The NMOS transistor 528 has a gate connected to a SC1 signal via an inverter 524 and a source connected to a drain of NMOS transistor 530. The NMOS transistor 530 has a gate connected to an output of inverter 532 and a source connected to ground. An input for inverter 532 is obtained from the connection between PMOS transistor 518 and NMOS transistor 520 and the connection between PMOS transistor 526 and NMOS transistor 528.

State element circuit 512 includes a PMOS transistor 540 having a source connected to $V_{DD}$, a gate connected to an output of inverter 532, and a drain connected to a source of PMOS transistor 542. The PMOS transistor 542 has a drain connected to a drain of NMOS transistor 544 and a gate connected to a SC2 signal via an inverter 548. The NMOS transistor 544 has a gate connected to a SC2 signal and a source connected to a drain of NMOS transistor 546. The NMOS transistor 546 has a gate connected to an output of inverter gate 532 and a source connected to ground. Input circuit 512 further includes a PMOS transistor 550 having a source connected to $V_{DD}$, a gate connected to qf, and a drain connected to a source of PMOS transistor 552. The PMOS transistor 552 has a drain connected to a drain of NMOS transistor 554 and a gate connected to a SC2 signal. The NMOS transistor 554 has a gate connected to a SC2 signal via an inverter 548 and a source connected to a drain of NMOS transistor 556. The NMOS transistor 556 has a gate connected qf and a source connected to ground. A qf_x value may be obtained from the connection between PMOS transistor 542 and NMOS transistor 544 and the connection between PMOS transistor 552 and NMOS transistor 554.

Output circuit 514 includes a PMOS transistor 560 having a source connected to $V_{DD}$, a gate tied to qf_x, and a drain connected to a source of PMOS transistor 562. The PMOS transistor 562 has a drain connected to a drain of NMOS transistor 564 and a gate connected to a CLK signal. The NMOS transistor 564 has a gate connected to a CLK_B signal (which is the D_F signal) and a source connected to a drain of NMOS transistor 568. A NMOS transistor 572 is connected in parallel with NMOS transistor 564, the NMOS transistor 572 having a gated connected to a SSE signal. The NMOS transistor 568 has a gate tied to qf_x and a source connected to ground. An inverter 570 has qf_x as an input and SDO as an output.

Operationally, the fault tolerant glitch latch 400 shown in FIGS. 4 and 5 prevents a stuck-at zero fault from propagating through the fault tolerant glitch latch 400. The scan shift enable signal controls a switch connected in series with the data input switch such that a stuck-at zero fault is prevented from driving voltage to a state node (i.e., qf) during a scan shift operation. In particular, by connecting the PMOS transistor 412 (a first SSE transistor) in series with the PMOS transistor 414 (the data input or data fault transistor), assertion of the scan shift enable signal during a scan operation turns off the PMOS transistor 412 and prevents the state node from being pulled high even if the PMOS transistor 414 is turned on due to the stuck-at zero fault. The state node therefore can be driven by the scan data.

In addition, as shown in FIG. 5, by connecting the NMOS transistor 572 (the second SSE transistor) in parallel with the NMOS transistor 564 (the second data input or data fault transistor), assertion of the scan shift enable during the scan operation turns on the NMOS transistor 572 and provides a path for qf to be driven to ground through the scan path when the scan data is low. The state node therefore is driven by the scan data during a scan shift operation and a stuck-at zero fault is operationally transparent. During a non-scan shift operation, SSE is not asserted and the fault tolerant glitch latch 400 functionally behaves as a standard glitch latch.

Figure 6:
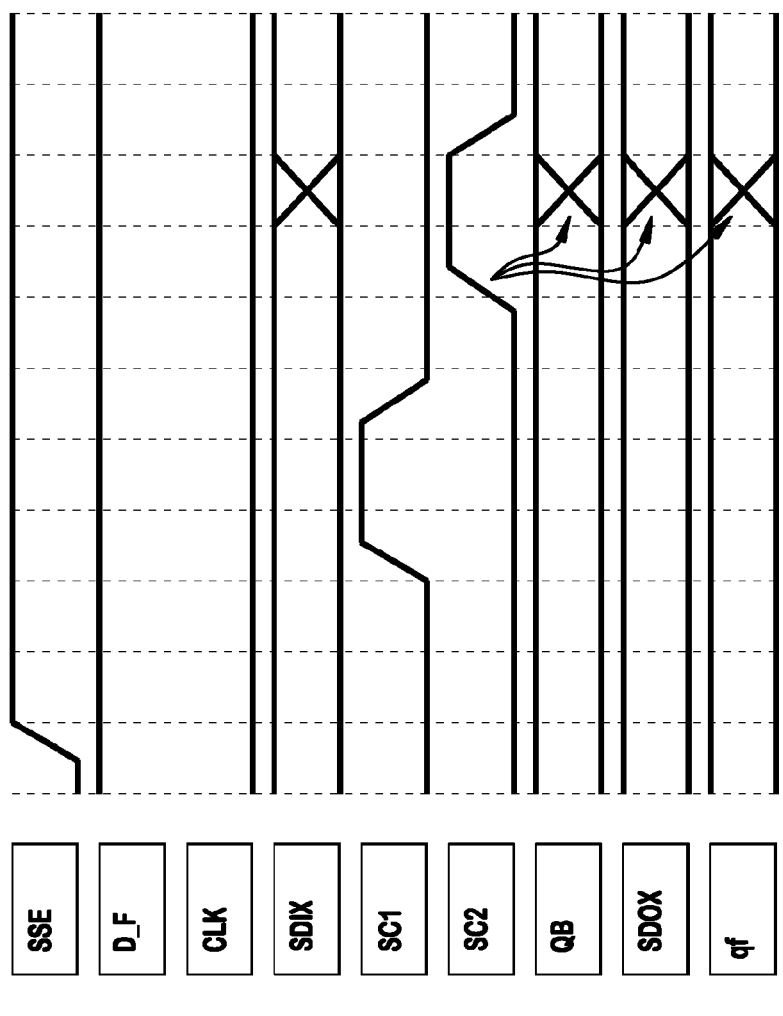
FIG. 6 is an example timing diagram for a fault tolerant scannable glitch latch with no faults.

FIG. 6 illustrates a scan timing diagram 600 for the fault tolerant scannable glitch latch 600 with no faults. The SSE is asserted during a scan shift operation and is set to high. During a scan shift operation, the array is in a precharge state (i.e., the array superbit lines are set to high) and the D_F input is high. The CLK is disabled and set to low during a scan shift. SDIX scans data in via SC1 and SC2. In particular, SC1 clocks scan data input into the master scan latch 510. SC2 clocks scan data input from the master scan latch 510 into the slave scan latch 512 and the two outputs QB and SDOX. The state node, qf, also follows the scan data input.

Figure 7:
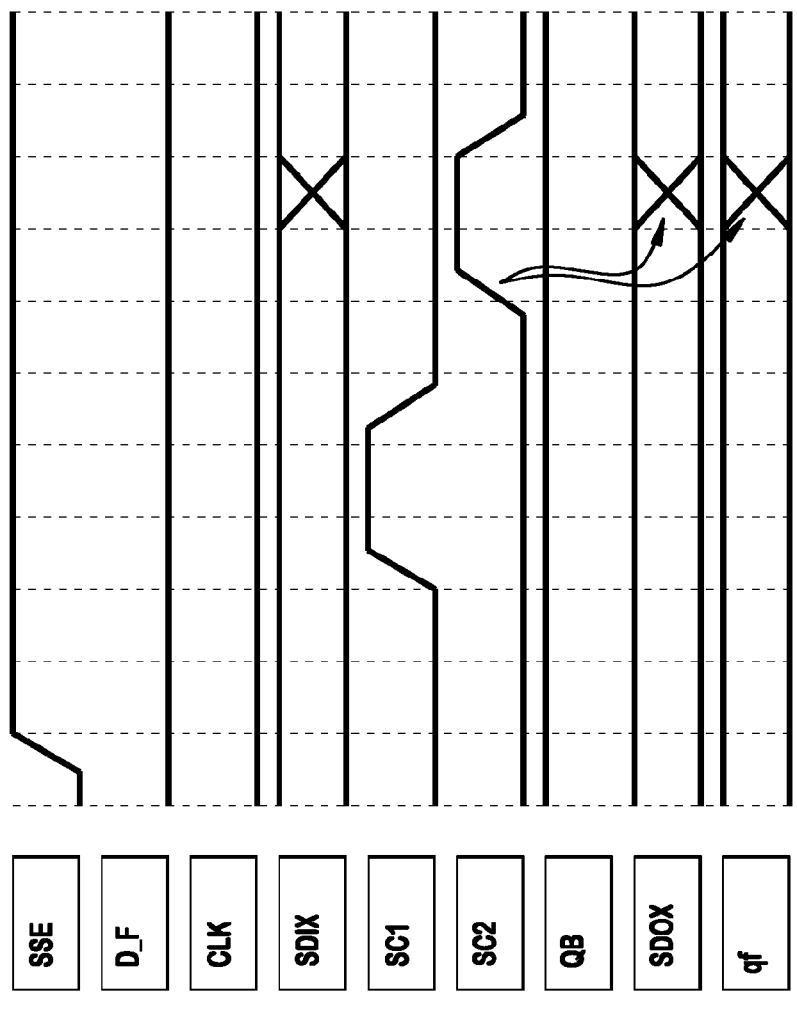
FIG. 7 is an example timing diagram for a fault tolerant scannable glitch latch with a stuck-at zero fault.

FIG. 7 illustrates a scan timing diagram 700 for the fault tolerant scannable glitch latch 600 with a stuck-at zero fault at the D_F input. Again, the SSE is asserted during a scan shift operation and is set to high. During a scan shift operation, the array is in a precharge state (i.e., the array superbit lines are set to high), but due to the stuck-at zero fault, the D_F input is low. As before, the CLK is disabled and set to low during a scan shift. SDIX scans data in via SC1 and SC2. In particular, SC1 clocks scan data input into the master scan latch 510. SC2 clocks scan data input from the master scan latch 510 into the slave scan latch 512 and the two outputs QB and SDOX. Although QB is stuck-at one due to the stuck-at zero fault, the addition of the PMOS and NMOS switches as discussed herein and the assertion of the SSE during the scan shift operation allows qf to be driven by the scan data input.

Embodiments of the present invention may be represented as instructions and data stored in a computer-readable storage medium. For example, aspects of the present invention may be implemented using Verilog, which is a hardware description language (HDL). When processed, Verilog data instructions may generate other intermediary data, (e.g., netlists, GDS data, or the like), that may be used to perform a manufacturing process implemented in a semiconductor fabrication facility. The manufacturing process may be adapted to manufacture semiconductor devices (e.g., processors) that embody various aspects of the present invention.

Although features and elements are described above in particular combinations, each feature or element can be used alone without the other features and elements or in various combinations with or without other features and elements. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions (such instructions capable of being stored on a computer readable media). The results of such processing may be maskworks that are then used in a semiconductor manufacturing process to manufacture a processor which implements aspects of the present invention.

What is claimed is:

1. A scannable glitch latch, comprising:
a scan control enable input;
a data input;
an input circuit connected to the scan control enable input and the data input; and
a state node tied to the input circuit, wherein assertion of the scan control enable input during a scan shift operation prevents the state node from being pulled high for any data input state.

2. The latch of claim 1, further comprising:
a scannable latch connected to the scan control enable input and the data input, wherein assertion of the scan control enable provides a ground path for the state node for any data input state.

3. The latch of claim 2, wherein the scannable latch includes:
a first transistor controlled by the scan control enable input; and
a second transistor connected in parallel with the first transistor and controlled by the data input.

4. The latch of claim 3, wherein the fourth transistor is a n-channel metal-oxide-semiconductor field-effect transistor.

5. The latch of claim 2, wherein:
the input circuit includes a first transistor controlled by the scan control enable input and a second transistor connected in series with the first transistor and controlled by the data input; and
the scannable latch includes a third transistor controlled by the scan control enable input and a fourth transistor connected in parallel with the third transistor and controlled by the data input.

6. The latch of claim 5, wherein the state node is tied to the second transistor and at least the fourth transistor.

7. The latch of claim 5, wherein the first transistor is a p-channel metal-oxide-semiconductor field-effect transistor and the fourth transistor is a n-channel metal-oxide-semiconductor field-effect transistor.

8. The latch of claim 1, wherein the input circuit includes:
a first transistor controlled by the scan control enable input; and
a second transistor connected in series with the first transistor and controlled by the data input.

9. The latch of claim 8, wherein the first transistor is a p-channel metal-oxide-semiconductor field-effect transistor.

10. A logic element, comprising:
a first switch controlled by a scan control enable input;
a second switch connected in series with first switch and controlled by a data input; and
a state node tied to the second switch, wherein assertion of the scan control enable input during a scan shift operation prevents the state node from being pulled high for a stuck-at zero fault at the data input.

11. The logic element of claim 10, further comprising:
a third switch connected to the scan control enable input;
a fourth switch connected in parallel to the third switch and controlled by the data input, wherein assertion of the scan control enable provides a ground path for the state node for the stuck-at zero fault at the data input.

12. The logic element of claim 11, wherein the state node is further tied to the fourth switch.

13. The logic element of claim 11, wherein the first switch is a p-channel metal-oxide-semiconductor field-effect transistor and the fourth switch is a n-channel metal-oxide-semiconductor field-effect transistor.

14. A method for performing a scan shift operation, comprising:
providing a first switch controlled by scan shift enable;
providing a second switch connected in serially to the first switch and controlled by data input;
asserting the scan shift enable during the scan shift operation; and
preventing a state node, tied to the second switch, from being pulled high for a stuck-at zero fault at the data input.

15. The method of claim 14, further comprising:
providing a third switch controlled by the scan control enable; and
providing a fourth switch connected in parallel to the third switch and controlled by the data input, wherein asserting the scan control enable provides a ground path for the state node for the stuck-at zero fault at the data input.

16. The method of claim 15, wherein the state node is further tied to the fourth switch.

17. The method of claim 15, wherein the first switch is a p-channel metal-oxide-semiconductor field-effect transistor and the fourth switch is an n-channel metal-oxide-semiconductor field-effect transistor.

18. A non-transitory computer readable media including hardware description language (HDL) code stored thereon, and when processed generates other intermediary data to create mask works for use in fabricating a processor that is configured to perform a method of scan shifting, the method comprising:
providing a first switch controlled by scan shift enable;
providing a second switch connected in serially to the first switch and controlled by data input;
asserting the scan shift enable during the scan shift operation; and
preventing a state node, tied to the second switch, from being pulled high for a stuck-at zero fault at the data input.

19. The method of claim 18, further comprising:
providing a third switch controlled by the scan shift enable; and
providing a fourth switch connected in parallel to the third switch and controlled by the data input, wherein asserting the scan shift enable provides a ground path for the state node for the stuck-at zero fault at the data input.

20. The method of claim 19, wherein the state node is further tied to the fourth switch.

21. The method of claim 19, wherein the first switch is a p-channel metal-oxide-semiconductor field-effect transistor and the fourth switch is an n-channel metal-oxide-semiconductor field-effect transistor.

* * * * *